United States Patent

Ellis-Monaghan et al.

[11] Patent Number: 6,040,991
[45] Date of Patent: Mar. 21, 2000

[54] SRAM MEMORY CELL HAVING REDUCED SURFACE AREA

[75] Inventors: John J. Ellis-Monaghan, Grand Isle; Wilbur D. Pricer, Charlotte, both of Vt.

[73] Assignee: International Business Machines Corporation, Armonk, N.Y.

[21] Appl. No.: 09/225,074

[22] Filed: Jan. 4, 1999

[51] Int. Cl.$^7$ .................................................. G11C 11/00
[52] U.S. Cl. .......................... 365/154; 365/156; 365/190
[58] Field of Search .................................... 365/154, 156, 365/190

[56] References Cited

U.S. PATENT DOCUMENTS

| | | | |
|---|---|---|---|
| 3,969,708 | 7/1976 | Sonoda | 340/173 |
| 4,023,149 | 5/1977 | Bormann et al. | 340/173 |
| 4,740,714 | 4/1988 | Masaki et al. | 307/279 |
| 4,858,182 | 8/1989 | Pang et al. | 365/156 |
| 5,020,028 | 5/1991 | Wanlass | 365/154 |
| 5,475,633 | 12/1995 | Mehalel | 365/154 |
| 5,475,638 | 12/1995 | Anami et al. | 365/154 |
| 5,535,155 | 7/1996 | Abe | 365/154 |
| 5,550,771 | 8/1996 | Hatori | 365/154 |
| 5,570,312 | 10/1996 | Fu | 365/154 |
| 5,631,863 | 5/1997 | Fechner et al. | 365/154 |
| 5,668,770 | 9/1997 | Itoh et al. | 365/154 |

OTHER PUBLICATIONS

Yoshida, T., et al., "Crystallization Technology for Low Voltage Operated TFT," 844–IEDM 91, pp. 32.6.1–32.6.4 IEEE (1991).

Kuriyama, H., et al., "A C–Switch Cell for Low–Voltage Operation and High–Density SRAMs," IEDM 96–279, pp. 11.3.1–11.3.4, IEEE (1996).

Primary Examiner—David Nelms
Assistant Examiner—Tuan T. Nguyen
Attorney, Agent, or Firm—Pollock, Vande, Sande & Amernick; Eugene I. Shkurko

[57] ABSTRACT

A Static RAM cell having a reduced surface area. The Static RAM cell includes a pair of P channel transistors and a pair of N channel transistors connected as a bistable latch. A first common source connection of the latch is connected to a Write Bit terminal and the remaining source connections of the latch are connected to complementary bit lines. A word line addressing the latch is provided through the transistors connected to the Bit Lines having shared body contact which permits reading and writing to the latch. During a write mode, the word line is connected to a potential which renders transistors connected to the complementary bit lines conductive, while the write bit connected to a potential which renders the remaining transistors nonconducting. During a read operation, one of the remaining transistors are rendered conductive, and the word line renders the set of transistors connected to the Bit Lines conductive so that the bit Lines are charged from the respective nodes of the latch.

23 Claims, 4 Drawing Sheets

6,040,991

SRAM MEMORY CELL HAVING REDUCED SURFACE AREA

BACKGROUND OF THE INVENTION

The present invention relates in particular to the CMOS Static Random Access Memory (RAM) art. Specifically, a Static RAM cell is disclosed having a reduced transistor count and a corresponding reduced surface area.

A standard CMOS Static RAM cell typically consists of six field effect transistors (FETs), as shown more particularly in FIG. 1. The RAM cell stores data as a voltage differential on first and second nodes 11 and 12 of a cross-coupled latch circuit. The cross-coupled latch circuit includes PMOS pull-up transistors 14 and 15 serially connected with two pulldown NMOS transistors 17 and 18. The state of the latch is changed by forcing the nodes 11 and 12 to a voltage differential representing a desired state identified by the data on complementary bit lines B0 and B1. During a write operation the Word line is enabled, thus connecting complementary bit lines B0 and B1 through access transistors 20 and 21 to the nodes 11 and 12. The latch circuit regeneratively forces the nodes 11 and 12 to assume the states of bit lines B0 and B1.

The conventional SRAM of FIG. 1 is constructed so that during a read operation, the loading presented by bit lines B0, B1 does not disturb the state of the cross-coupled latch, while at the same time during a write operation, sufficient current is supplied to nodes 11 and 12 from bit lines B0, B1 to force the latch to change state.

These competing objectives are accomplished by selectively choosing the current carrying capacity of the latch transistors 14–18, and the access transistors 20 and 21. The selection of the current carrying capacity of these devices leads to the use of devices which are larger than otherwise needed to store the data. The larger devices, in turn, expand the substrate area occupied by each CMOS RAM cell.

The present invention is designed to reduce the size of the CMOS RAM cell in more than one way. The reduction in surface area for each CMOS RAM cell provides a desirable increase in memory density, and permits larger memories to be implemented on the same surface area of the substrate.

SUMMARY OF THE INVENTION

In accordance with the invention, a new Static RAM cell is provided which eliminates the two access transistors of the prior art CMOS Static RAM cell, thus reducing the overall surface area of the RAM cell.

The RAM cell is comprised of a pair of pull-up and a pair of pull-down field effect transistors connected as a cross-coupled latch. The complementary bit lines are connected to the source connections of one side of the latch, while the source connections of the remaining side of the latch are connected to a write bit terminal. The transistors which are connected to the complementary bit lines B0 and B1 include a shared contact connected to a diffusion region extending under the channel of each transistor which forms a body contact to each of these transistors. The common terminal of these body contacts is connected to the word line.

During a read operation, the word line is driven to a potential which renders both transistors connected to the bit lines conductive, thereby conducting a sense signal from the latch to the bit lines. During a write operation, the word line and write bit connection receive a voltage potential which renders the transistors connected to the bit lines conducting, while rendering the remaining transistors nonconductive, and the latch assumes the state represented by a small differential signal on the complementary bit lines B0 and B1.

DESCRIPTION OF THE DRAWINGS

FIG. 2b represents an implementation of the RAM cell of FIG. 2a in an array where an entire Word line is to be simultaneously written to;

FIG. 2c illustrates the configuration of a Static RAM cell in accordance with a preferred embodiment in an array where a single bit of the array is to be written to;

FIG. 3 represents the read and write waveforms for reading data and writing data from and to the Static RAM cell of FIG. 2a;

DETAILED DESCRIPTION OF THE INVENTION

Figure 1:
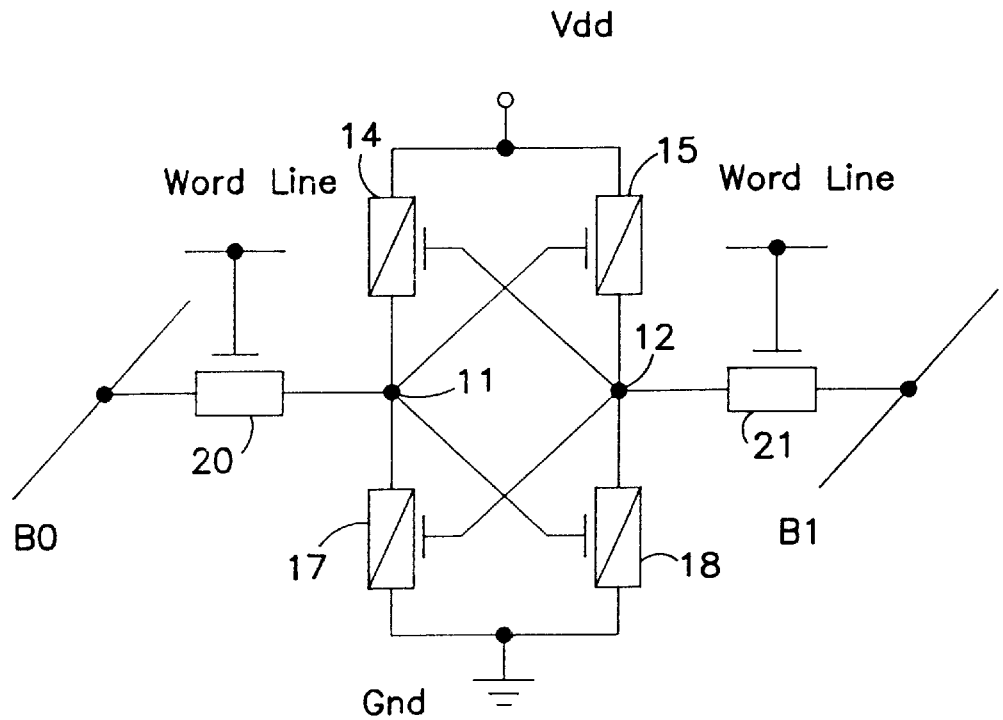
FIG. 1 represents a prior art CMOS Static RAM cell.
Figure 2A:
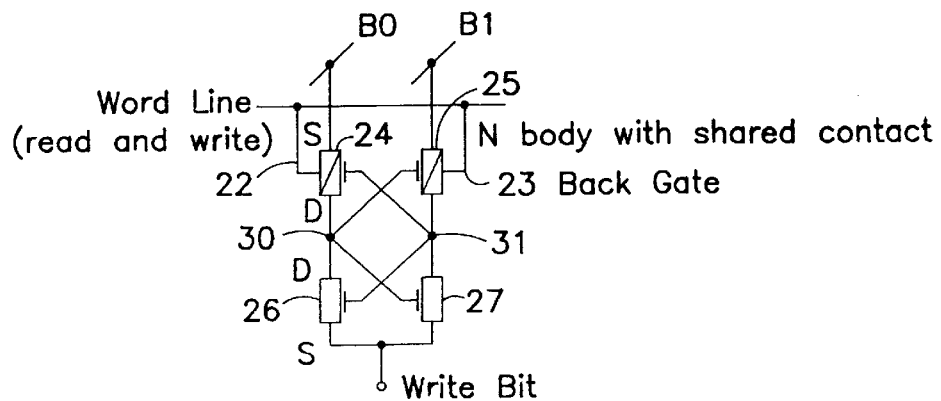
FIG. 2a represents a first embodiment of the Static RAM cell in accordance with the invention.

Referring now to FIG. 2a, the structure of an SRAM cell is shown occupying less surface area than the prior art SRAM cell of FIG. 1. The embodiment of FIG. 2a eliminates the access transistors 20 and 21 (FIG. 1), thereby reducing the transistor count and the surface area necessary for the additional transistors. Further, the remaining transistors 24–27 may be sized more ideally, as the problem of providing enough drive current to set the nodes 30 and 31 at the data levels B0, B1 while at the same time avoiding disturbing the contents of the memory cell during a read operation, are substantially avoided.

Writing the Static RAM cell of FIG. 2a is controlled by the voltage provided on the shared body contact 22, 23 of P channel transistors 24 and 25 which are the pull-up transistors of the latch. The shared contacts 22, 23 are connected to the word line, and when the Word line is driven below Vdd, B0 and B1 are applied to nodes 30 and 31. Simultaneously, the write bit line connected to the sources of the N channel transistors 26 and 27 is held to a positive value Vdd. During the write sequence, shown more particularly in FIG. 3, N channel transistors 26 and 27 are rendered nonconductive, as the source voltage is greater or equal to the gate voltage, when the write bit line is held high. Complementary data is applied to B0 and B1. When the write bit line is returned low the data is latched within the cell. The word line is then deselected.

Figure 3:
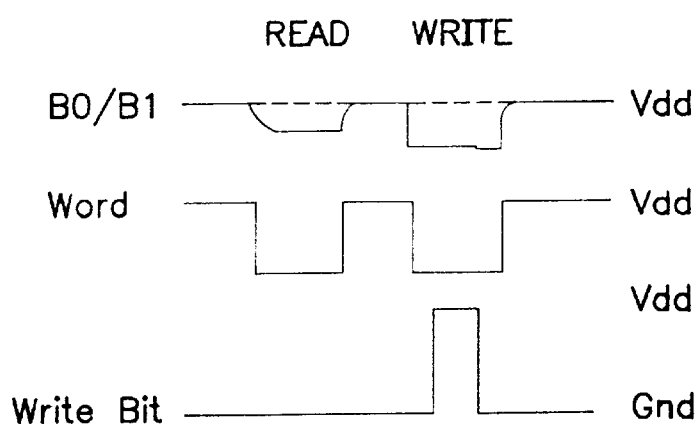

A read operation is also demonstrated in FIG. 3. During a read operation, the latch is in its bistable condition, establishing a differential voltage between nodes 30 and 31. As the word line is dropped below the value necessary to make both P channel transistors conductive, the nodes 30 and 31 are resistively connected to the bit lines B0 and B1, charging the Bit Lines B0 and B1 to a value approaching the node voltages on nodes 30 and 31. The Static RAM cell draws no significant current in the quiescent, or unread state. During a read operation, a negative going pulse is applied to the Word line, and the P channel transistors operate as depletion mode devices conducting current into the bit lines. The current from the internal cell nodes charging the bit lines is used to sense the state of the cell. Although the word selection pulse renders both P channel devices into the depletion mode, the effective differential between devices is maintained as the previously conducting P channel transistor becomes more conductive, maintaining the voltage differential which defines the values stored on each of the nodes.

Figure 4:
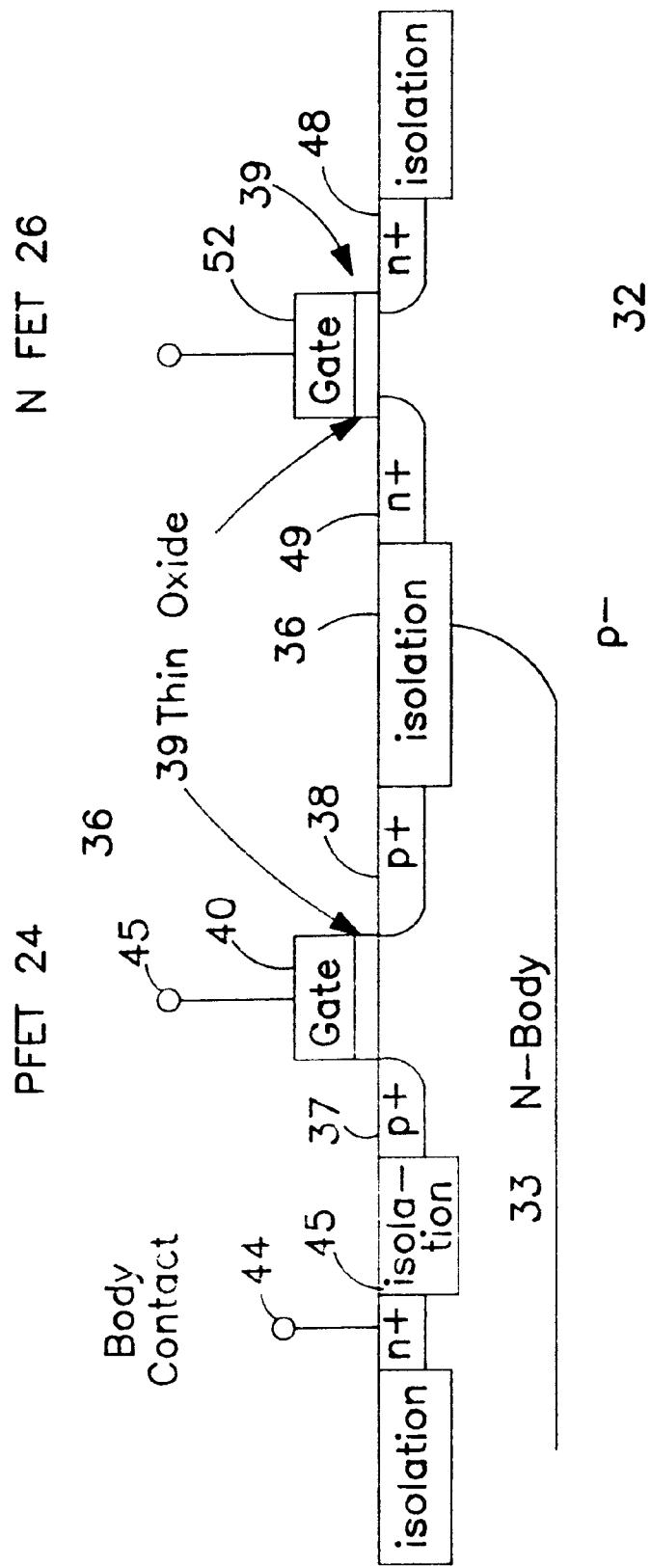
FIG. 4 shows the construction of the P channel pull-up transistors having a shared body contact providing a gating function.

FIG. 4 illustrates the structure of the P channel transistor which provides for the body contact (22, 23 of FIG. 2a.) for enabling reading and writing of data to the cross-coupled latch. Referring now to FIG. 4, a substrate 32 is shown in which the latch transistors 24 and 26 are implemented. P channel transistor 24 and P channel transistor 25 are created in an N well diffusion layer 33 formed in the P-minus doped substrate 32. The N well diffusion layer 33 is doped with a sufficient N doping to overcome the P-doping of the substrate 32 forming an N body. An isolation structure 36 is provided to separate the N body 33 from the N channel transistors 26 and 27. Source and drain regions 37 and 38 are formed by heavily doped P+ regions in the N well 33. A thin oxide 39 as is known in the CMOS technology insulates the N well region under the channel 33 from a gate 40.

The inversion channel formed between the source and drain regions 37 and 38 is modulated by the voltage applied to the underside body contact 44. Body contact 44 to the N body 33 is provided by N+ doped region 45. The gate voltage on gate 40 as well as the voltage applied to body contact 44 can be used to control conduction through the channel.

The N channel transistors 26 and 27 are implemented in the substrate 32 using conventional CMOS technology by creating the source and drain 48 and 49 of N+ doped regions having a thin gate oxide 39. A gate 52 is constructed over the thin film layer 39 above a channel operating in the enhancement mode. Those skilled in the art will recognize that this cell can be readily fabricated in SOI technology wherein the electrically isolated transistor body forms a convenient contact to the word line.

Figure 2B:
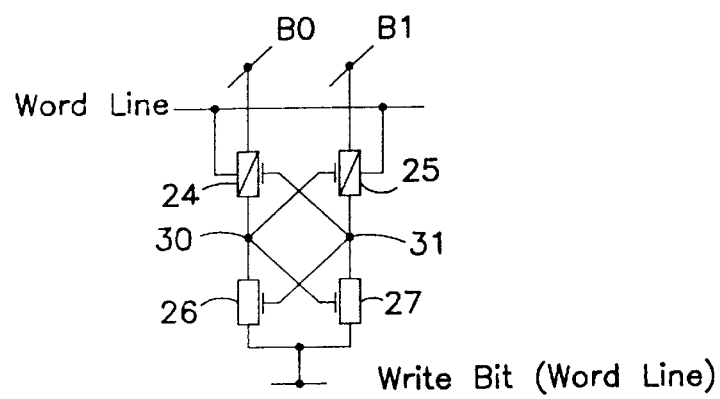
Figure 2C:
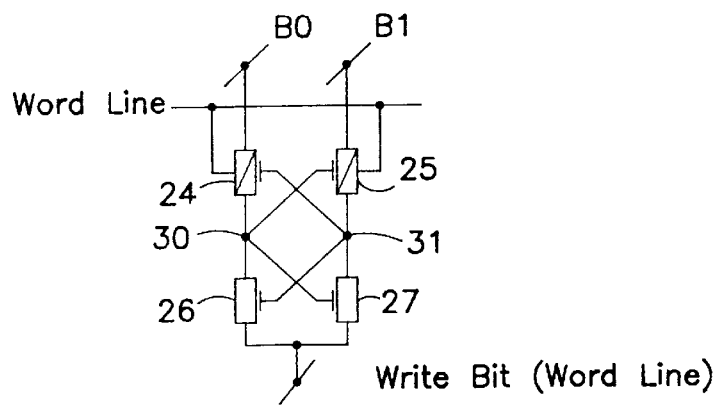

The Static RAM cell in accordance with the present invention provides for independent addressing of each RAM cell. As is evident from FIG. 1, the conventional RAM cell addresses the cells of an entire word line when operating in either a read or write operation. Because of the additional write bit terminal for the RAM cell of the present invention, it is possible to unambiguously selectively address individual cells connected to a common word line in the configuration shown in FIG. 2c. Alternatively, the write bit may be connected in parallel to the word line, such that all cells within a word line are commonly addressed and the cells of an entire Word line may be written at the same time.

The ability to address individual cells of an array is advantageous when large arrays are addressed with less than a full word line of data while being read or written to. In these instances, it will be possible to address only the number of cells for which data is presently available, thus avoiding having to address an entire word line when only a partial number of cells are to be read or written to.

Figure 5:
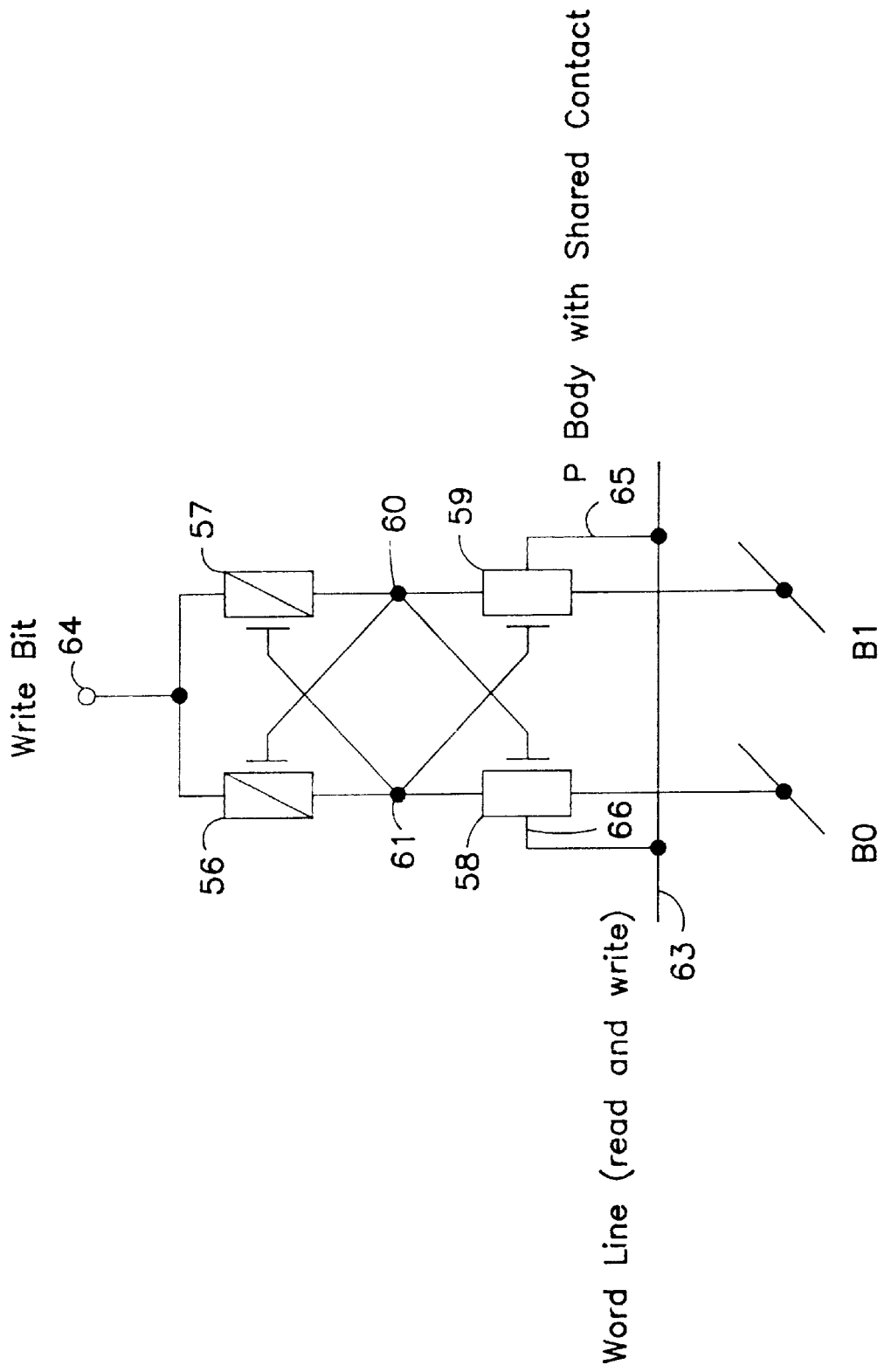
FIG. 5 illustrates the implementation of the invention wherein N channel transistors provide node selection during reading and writing.

FIG. 5 shows how the RAM cell can be constructed in which the roles of the N channel and P channel transistors are reversed. In the embodiment shown in FIG. 5, the additional connection for the word line is achieved through a P body having a shared contact 65, 66 with N channel transistors 58, 59. The cross-coupled latch comprising P channel transistors 56, 57 and N channel transistors 58, 59 provide data from nodes 60 and 61 to complementary bit lines B0 and B1. A corresponding complementing sequence of voltage pulses on word line 63 and write bit line 64 are used to read and write data as set forth in the sequence shown in FIG. 3 with the voltages and pulse polarities appropriately reversed for N versus P channel characteristics. The N channel transistors 58, 59 are formed in a diffusion P well, similar to the P channel transistor of FIG. 4.

The inventive RAM cell may also be advantageously embodied in thin film technology. In this embodiment the transistors connected to the bit lines whether P or N channel (FIG. 2 or FIG. 5) reside in the thin film polysilicon region directly over the single crystal region of the other two transistors. This thin film embodiment further roughly halves the substrate area necessary for a RAM cell. Examples of thin film technology can be found in Kuriyama, H., et al., "A C-Switch Cell for Low-Voltage Operation and High-Density SRAMs," IEDM 96–279, pp. 11.3.1–11.3.4, IEEE (1996); and Yoshida, T., et al., "Crystallization Technology for Low Voltage Operated TFT," 884-IEDM 91, pp. 32.6.1–32.6.4 IEEE (1991).

Thus, there has been described a Static RAM cell which includes a reduced transistor count, as well as optimized latch transistors which reduce the overall SRAM memory area. Those skilled in the art will recognize other embodiments described more particularly by the claims appended hereto.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A static RAM cell comprising:

first pair of transistors, each of said transistors including a source, a drain, a gate and a body contact for controlling conduction of a respective transistor;

a second pair of transistors having drain connections connected to drain connections of said first pair of transistors, and having source connections connected together, each of said pairs of transistors having gate connections cross coupled to drains of an opposite transistor of a respective pair of transistors to form a bistable latch;

a pair of complementary bit lines connected to the source connections of said first pair of transistors having said body contact;

a word line connected to the body contact of each transistor having said body contact; and a write terminal connected to said source connections of said second pair of transistors.

2. The static RAM cell of claim 1 wherein said first pair of transistors are P channel transistors.

3. The RAM cell of claim 1 wherein one of said pairs of transistors are thin film transistors.

4. The static RAM cell of claim 1 wherein said first pair of transistors are N channel transistors.

5. The static RAM cell of claim 1 wherein the body of said first pair of transistors is fabricated in SOI technology.

6. A static RAM cell comprising:
first and second P channel transistors, each having a source, drain, insulated gate and a shared N body contact, the gates of each of said transistors being connected to a drain of the other transistor;
a pair of complementary bit lines connected to the sources of said first transistor and said second transistor;
a word line connected to the body contact of each of said P channel transistors;
a first N channel transistor having a drain connected to the drain of said first P channel transistor forming a first node, a gate connected to the drain of said second P channel transistor, and a source;
a second N channel transistor having a drain connected to the drain of said second P channel transistor forming a second node, a gate connected to the drain of said first P channel transistor, and a source connected to said first N channel transistor source; and
a bit write line connected to said first and second N channel transistor sources, said bit write line enabling data on said pair of complementary lines to establish first and second voltage levels on said first and second nodes corresponding to a state represented by the voltage of said complementary bit lines.

7. The static RAM cell according to claim 6 wherein said P channel transistors are formed adjacent to said N channel transistors, and separated there from by an isolation region.

8. The static RAM cell according to claim 7 wherein said P channel transistors are formed in an N well of a lightly doped P substrate, and a connection is formed in said N well constituting said body contact.

9. The static RAM cell according to claim 7 in which the P channel transistors are formed in SOI technology.

10. The static RAM cell according to claim 6 wherein during a read operation, said Word line is maintained at a voltage potential less than the potential on said bit lines, whereby the data represented by the voltage at said first and second nodes is transferred to said complementary bit lines.

11. The static RAM cell according to claim 10 wherein during a write operation, said write line potential is increased to render said N channel transistors non conducting, and said word line voltage potential is lowered to a level below the voltage potential on said complementary bit lines, whereby said first and second nodes assume a voltage differential on said complementary bit lines and maintain said voltage differential when said write line potential is decreased.

12. A static RAM cell comprising:
a first pair of N channel transistors, having a common source connection which is connected to a write enable line, and each having a gate connection connected to a drain of the other transistor;
a first pair of P channel transistors each having drain connection connected to a drain connection of said first pair of N channel transistors, a shared body contact, and having a gate connection connected to a drain of an opposite P channel transistor;
a word line connected to a shared contact of each P channel transistors; and complementary bit lines connected to the sources of said P channel transistors for detecting the state of said static ram cell from the respective current flowing in said bit lines when said Word line is enabled.

13. The static RAM cell according to claim 12 wherein said write enable line is connected to be enabled when said Word line is enabled.

14. The static RAM cell according to claim 12 wherein the conductivity of said P channel transistors increases when said Word line is enabled, thereby identifying the value of data stored in said static ram cell.

15. A static RAM cell comprising:
a first pair of P channel field effect transistors having source connections connected to a write bit terminal, and having gate connections cross coupled to the opposite P channel transistor drain connection of said first pair of transistors;
a first pair of N channel field effect transistors having drain connections connected to drain connections of said first pair of P channel transistors, a shared body contact, and having gate connections connected to the drain connections of the opposite transistor of said first pair of N channel field effect transistors;
a Word line connected to said shared body contact of said N channel field effect transistors; and
first and second complementary bit lines connected to the source connection of said second pair of N channel field effect transistors.

16. The static RAM cell of claim 15 wherein said write bit terminal is connected to be enabled simultaneously with said word line.

17. The static RAM cell of claim 15 wherein during a write operation, said write bit terminal is connected to a voltage potential which inhibits conduction of said P channel transistors, and said word line is connected to a voltage potential which renders said N channel transistors conductive transferring the voltage differential from said complementary bit lines to said connected drains of said transistors.

18. The static RAM cell of claim 17 wherein during a read operation said write bit terminal is connected to a voltage potential which enables conduction of one of said P channel transistors, and said word line voltage potential is maintained at a level which enables conduction of said N channel transistors to charge said complementary bit lines to a voltage potential which represents a stored bit value.

19. The static RAM cell according to claim 17 wherein said N channel transistors are formed in an P body comprising a doped P region which is isolated from said P channel transistors.

20. The static RAM cell according to claim 17 wherein said N channel transistors are formed in SOI technology.

21. The static RAM cell according to claim 15 wherein said P channel field effect transistors are thin film P channel field effect transistors.

22. The static RAM cell according to claim 15 wherein said N channel field effect transistors are thin film N channel field effect transistors.

23. The static RAM cell according to claim 21 wherein said N channel field effect transistors are thin film N channel field effect transistors.

* * * * *